United States Patent
Li et al.

(10) Patent No.: US 11,031,457 B2
(45) Date of Patent: Jun. 8, 2021

(54) LOW RESISTANCE HIGH CAPACITANCE DENSITY MIM CAPACITOR

(71) Applicant: International Business Machines Corporation, Armonk, NY (US)

(72) Inventors: Baozhen Li, South Burlington, VT (US); Chih-Chao Yang, Glenmont, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 65 days.

(21) Appl. No.: 15/843,145

(22) Filed: Dec. 15, 2017

(65) Prior Publication Data

US 2019/0189735 A1    Jun. 20, 2019

(51) Int. Cl.
*H01L 23/522* (2006.01)
*H01L 27/108* (2006.01)
*H01L 49/02* (2006.01)

(52) U.S. Cl.
CPC .............. *H01L 28/60* (2013.01); *H01L 28/90* (2013.01); *H01L 28/55* (2013.01)

(58) Field of Classification Search
CPC ............................ H01L 28/60; H01L 23/5223
See application file for complete search history.

(56) References Cited

U.S. PATENT DOCUMENTS

| | | | |
|---|---|---|---|
| 5,675,184 A | 10/1997 | Matsubayashi et al. | |
| 5,879,985 A | 3/1999 | Gambino et al. | |
| 6,461,914 B1 | 10/2002 | Roberts et al. | |
| 6,528,366 B1* | 3/2003 | Tu | H01L 28/87 257/E21.016 |
| 6,670,237 B1 | 12/2003 | Loh et al. | |
| 6,764,915 B2 | 7/2004 | Lee | |
| 7,732,296 B2 | 6/2010 | Park et al. | |
| 7,879,681 B2 | 2/2011 | Kim et al. | |
| 8,508,019 B2 | 8/2013 | Riess | |
| 8,716,778 B2 | 5/2014 | Chen et al. | |
| 9,368,392 B2 | 6/2016 | Tseng et al. | |
| 9,397,038 B1* | 7/2016 | Uzoh | H01L 23/5223 |
| 9,773,781 B1 | 9/2017 | Zang et al. | |
| 9,793,264 B1 | 10/2017 | Jou et al. | |
| 2003/0113974 A1 | 6/2003 | Ning et al. | |
| 2003/0213990 A1 | 11/2003 | Tsai et al. | |
| 2005/0026361 A1* | 2/2005 | Graettinger | H01L 28/91 438/253 |

(Continued)

*Primary Examiner* — Omar F Mojaddedi
(74) *Attorney, Agent, or Firm* — Cantor Colburn LLP; L. Jeffrey Kelly

(57) ABSTRACT

Embodiments are directed to a method and resulting structures for forming low resistance, high capacitance density MIM capacitors. In a non-limiting embodiment, one or more bottom plate contacts are formed over a substrate. A bottom capacitor plate is formed directly on a top surface and a sidewall of each of the one or more bottom plate contacts. A capacitor dielectric layer is formed directly on a surface of the bottom capacitor plate. A top capacitor plate is formed directly on a surface of the capacitor dielectric layer. A first portion of the top capacitor plate extends past a sidewall of the bottom capacitor plate in a direction parallel to the substrate. A top plate contact is formed directly on the first portion of the top capacitor plate.

17 Claims, 12 Drawing Sheets

(56) References Cited

U.S. PATENT DOCUMENTS

| | | | |
|---|---|---|---|
| 2007/0059846 A1* | 3/2007 | Kobayashi | H01L 27/11502 |
| | | | 438/3 |
| 2007/0173049 A1* | 7/2007 | Kim | H01L 27/10852 |
| | | | 438/597 |
| 2010/0213572 A1* | 8/2010 | Ching | H01L 23/5223 |
| | | | 257/532 |
| 2011/0284991 A1* | 11/2011 | Hijioka | H01L 23/5223 |
| | | | 257/532 |
| 2012/0091519 A1* | 4/2012 | Tu | H01L 23/5223 |
| | | | 257/303 |
| 2013/0113072 A1 | 5/2013 | Liu et al. | |
| 2015/0357335 A1* | 12/2015 | Kunishima | H01L 27/10852 |
| | | | 257/296 |
| 2015/0364538 A1* | 12/2015 | Wang | H01L 28/65 |
| | | | 257/534 |

* cited by examiner

LOW RESISTANCE HIGH CAPACITANCE DENSITY MIM CAPACITOR

BACKGROUND

The present invention generally relates to capacitors. More specifically, the present invention relates to low resistance high capacitance density metal-insulator-metal (MIM) capacitors.

In semiconductor manufacturing processes, metal-type capacitors are widely used in the design of various devices and device components. Over time, MIM capacitors have become the main structure used for metal-type capacitors because MIM capacitors offer a combination of relatively low plate resistance, low parasitic capacitance, and an inherent ability to easily handle shifts of depletion induced voltage. For example, MIM capacitors have been widely used in functional circuits such as mixed signal circuits, analog circuits, radio frequency (RF) circuits, dynamic random access memory (DRAM), embedded DRAM, and logic operation circuits. MIM capacitors can be designed to accommodate a range of feature requirements, depending on the particular application. For example, in mixed signal circuits, capacitors are used as decoupling capacitors and high-frequency noise filters. For DRAM and embedded DRAM circuits, capacitors are used for memory storage. For RF circuits, capacitors are used in oscillators and phase-shift networks for coupling and/or bypassing purposes. For microprocessors, capacitors are used for decoupling. When used as decoupling capacitors, MIM capacitors need to be designed to sustain high voltages.

SUMMARY

Embodiments of the present invention are directed to a method for forming low resistance, high capacitance density MIM capacitors. A non-limiting example of the method includes forming one or more bottom plate contacts over a substrate. A bottom capacitor plate is formed directly on a top surface and a sidewall of each of the one or more bottom plate contacts. A capacitor dielectric layer is formed directly on a surface of the bottom capacitor plate. A top capacitor plate is formed directly on a surface of the capacitor dielectric layer. A first portion of the top capacitor plate extends past a sidewall of the bottom capacitor plate in a direction parallel to the substrate. A top plate contact is formed directly on the first portion of the top capacitor plate.

Embodiments of the invention are directed to a semiconductor device. A non-limiting example of the semiconductor device includes one or more bottom plate contacts formed over a substrate. A bottom capacitor plate is formed directly on a top surface and a sidewall of each of the one or more bottom plate contacts. A capacitor dielectric layer is formed directly on a surface of the bottom capacitor plate. A top capacitor plate is formed directly on a surface of the capacitor dielectric layer. A first portion of the top capacitor plate extends past a sidewall of the bottom capacitor plate in a direction parallel to the substrate. A top plate contact formed directly on the first portion of the top capacitor plate.

Embodiments of the invention are directed to a semiconductor device. A non-limiting example of the semiconductor device includes one or more bottom plate contacts formed over a substrate. A first capacitor plate is formed in direct contact with a top surface and a sidewall of each of the one or more bottom plate contacts. A first capacitor dielectric layer is formed in direct contact with a surface of the first capacitor plate. A second capacitor plate and a second capacitor dielectric layer are similarly formed over the first capacitor dielectric layer. A third capacitor plate is formed in direct contact with a surface of the second capacitor dielectric layer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
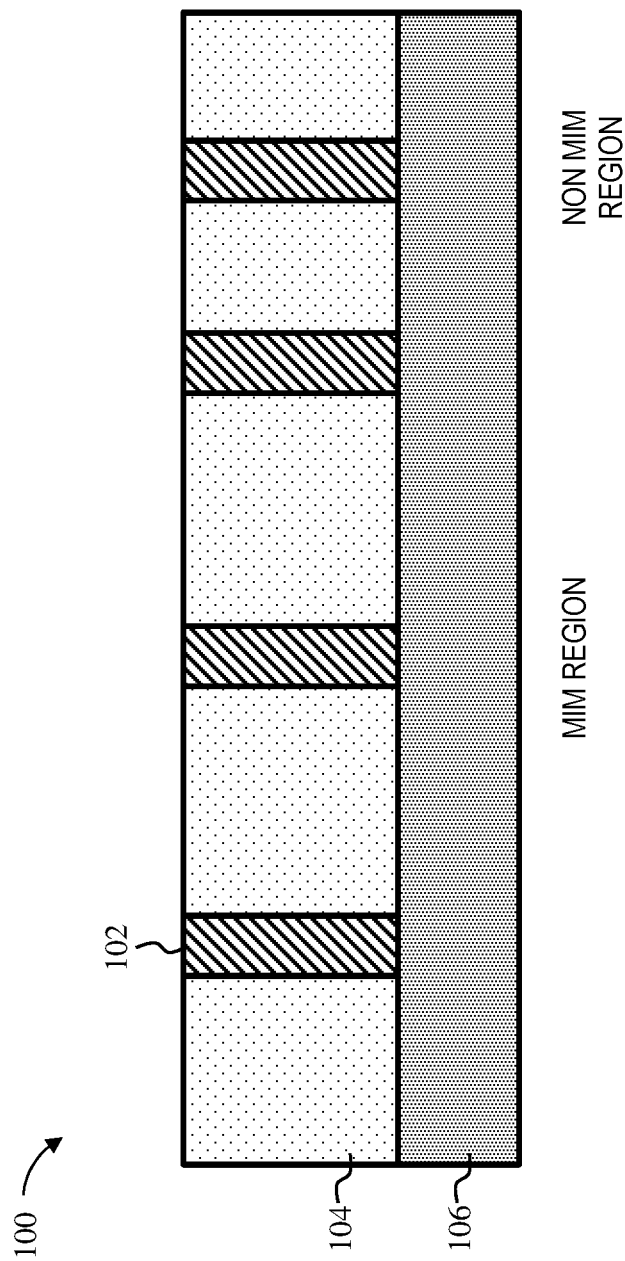
FIG. 1 depicts a cross-sectional view of a MIM capacitor after a fabrication operation according to embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to a semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as previously noted herein, MIM capacitors can be designed to serve as decoupling capacitors in a variety of applications. High performance IC chips, for example, require more and more decoupling capacitors to meet ever growing capacitance density requirements. Conventional MIM capacitors, however, offer somewhat limited performance. Conventional MIM capacitors provide a fairly low capacitance density and are not sufficient to meet growing demands for both 2-plate and 3-plate high density MIM capacitor applications. Moreover, conventional MIM capacitors are very defect prone, with defect densities greater than about 0.5 defects per $cm^2$ common. For example, during fabrication the top plate contact for a 2-plate MIM capacitor can easily short and cause dielectric damage. Conventional MIM capacitors also suffer from relatively low quality (Q) factors due to high plate-to-contact resistance. This problem is particularly evident for 3-plate MIM capacitors and is a major concern for future high performance, high frequency applications.

Turning now to an overview of aspects of the present invention, one or more embodiments of the invention provide a low resistance, high capacitance density MIM capacitor. This improved MIM capacitor extends the conventional planer MIM capacitor into a stacked plate 3-D MIM architecture to increase capacitance density. In some embodiments of the present invention, this improved MIM capacitor includes multiple stacks to further enhance capacitance density. Advantageously, plate-to-contact resistance is minimized in this 3-D MIM architecture by using metal lines to directly contact the capacitor plates.

Turning now to a more detailed description of aspects of the present invention, FIG. 1 depicts a cross-sectional view of a MIM capacitor 100 during an intermediate operation of a method of fabricating a semiconductor device according to one or more embodiments of the present invention. As depicted in FIG. 1, the MIM capacitor 100 includes one or more bottom plate contacts 102 formed in a dielectric layer 104. The bottom plate contacts 102 can be formed using known metallization techniques. In some embodiments of the invention, a thickness of the dielectric layer 104 is increased by depositing additional dielectric material prior to forming the bottom plate contacts 102. The dielectric layer 104 can then be patterned to open trenches (not depicted) using known processes, such as a wet or dry etch. In some embodiments of the invention, the bottom plate contacts 102 are overfilled into the trenches, forming over-burdens above a surface of the dielectric layer 104. In some embodiments of the invention, a CMP removes the overburden. In some embodiments of the present invention, the bottom plate contacts 102 are formed to a line width thickness of greater than or equal to about 0.1 microns, although other line widths are within the contemplated scope of the invention.

The bottom plate contacts 102 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments of the invention, the bottom plate contacts 102 can include a barrier metal liner (not depicted). The barrier metal liner prevents the metal from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

The dielectric layer 104 can be formed over a substrate 106 and can include any suitable dielectric material, such as, for example, a silicon oxide, silicon nitride, silicon oxynitride, or a combination thereof. The dielectric layer 104 can be formed using any suitable deposition process. In some embodiments of the present invention, the dielectric layer 104 is formed using CVD, PECVD, atomic layer deposition (ALD), evaporation, physical vapor deposition (PVD), chemical solution deposition, spin on, or other like processes. The substrate 106 can be any suitable substrate material, such as, for example, monocrystalline Si, SiGe, SiC, III-V compound semiconductor, II-VI compound semiconductor, or semiconductor-on-insulator (SOI). In some embodiments of the invention, the substrate 106 includes a buried oxide layer (not depicted). In some embodiments of the present invention, the substrate 106 includes front-end-of-line (FEOL) devices and one or more back-end-of-line (BEOL) metal or via layers.

Figure 2:
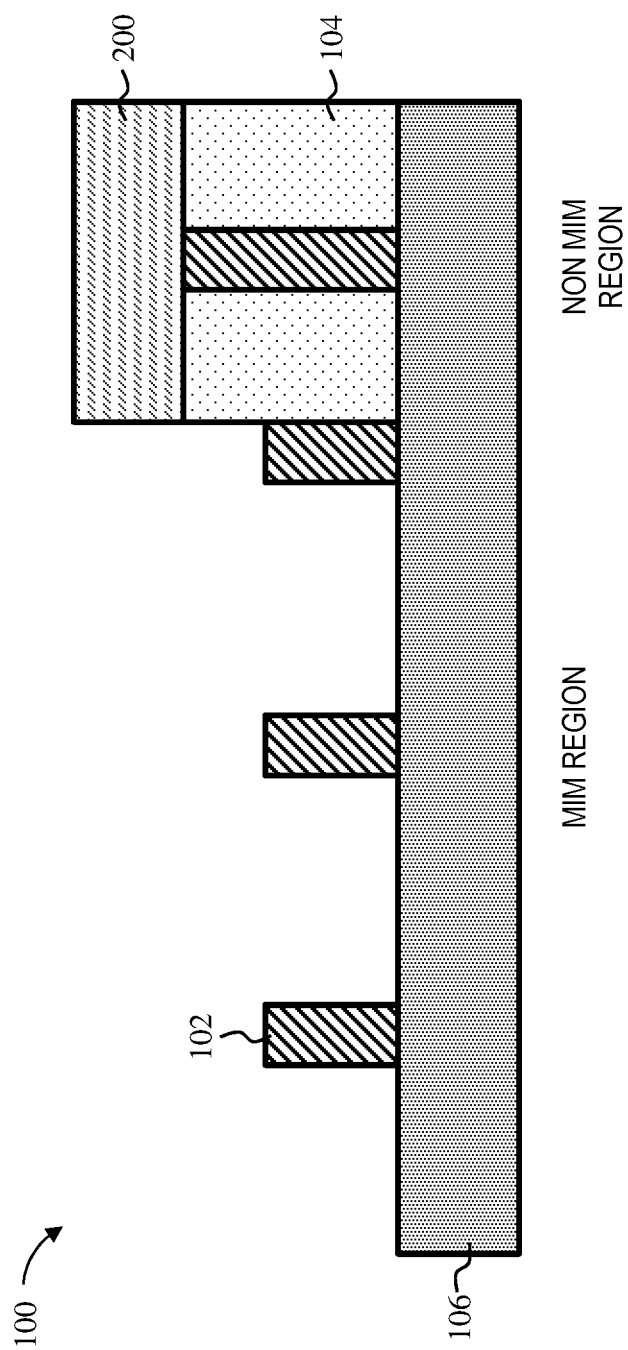
FIG. 2 depicts a cross-sectional view of the MIM capacitor of FIG. 1 after a fabrication operation according to embodiments of the invention.

FIG. 2 depicts a cross-sectional view of the MIM capacitor 100 after forming a hard mask 200 over the bottom plate contacts 102 in a non-MIM region of the substrate 106 during an intermediate operation of a method of fabricating a semiconductor device according to one or more embodiments of the present invention. The hard mask 200 can be any suitable mask material and can be patterned using any known process. In some embodiments of the invention, the hard mask 200 includes an oxide, such as, for example, $SiO_2$. In some embodiments of the invention, the hard mask 200 includes amorphous silicon (a-Si). In some embodiments of the invention, the hard mask 200 includes a nitride, such as, for example, silicon nitride.

After patterning the hard mask 200, the portion of the dielectric layer 104 in the MIM-region of the substrate 106 is recessed. The dielectric layer 104 can be patterned by any lithographic process or etching methodology, such as, for example, a wet etch, a dry etch, or a combination of sequential wet and/or dry etches. In some embodiments of the invention, the dielectric layer 104 is recessed using RIE. In some embodiments of the present invention, the RIE is selective to the bottom plate contacts 102 and/or the substrate 106. In some embodiments of the present invention, the bottom plate contacts 102 are partially recessed concurrently with the dielectric layer 104. In some embodiments of the present invention, the bottom plate contacts 102 are not recessed.

Figure 3:
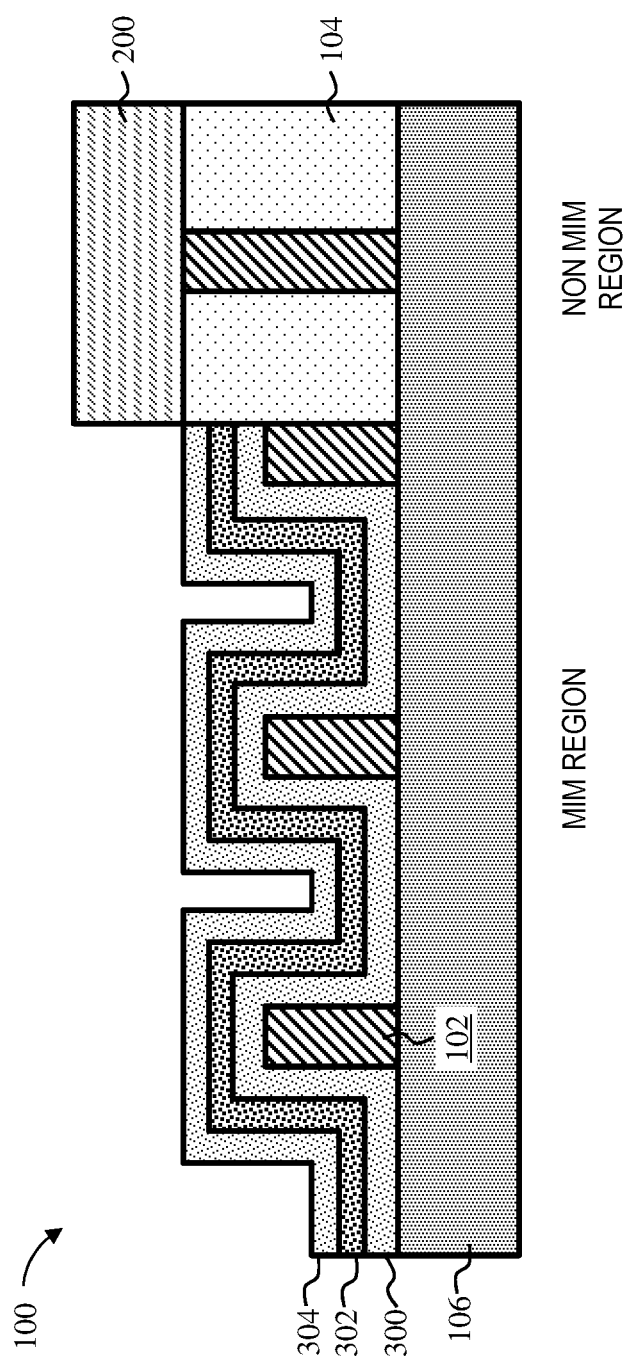
FIG. 3 depicts a cross-sectional view of the MIM capacitor of FIG. 2 after a fabrication operation according to embodiments of the invention.

FIG. 3 depicts a cross-sectional view of the MIM capacitor 100 after forming a bottom plate 300 (also known as a MIM capacitor plate), a capacitor dielectric layer 302, and a top plate 304 during an intermediate operation of a method of fabricating a semiconductor device according to one or more embodiments of the present invention. The bottom plate 300, capacitor dielectric layer 302, and top plate 304 together define a single MIM stack. The bottom plate 300 and the top plate 304 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. In some embodiments of the present invention, the bottom plate 300 and the top plate 304 include TiN or TaN. The bottom plate 300 and the top plate 304 can be formed using any suitable processes, such as, for example, a PVD process such as sputtering or a CVD process. In some embodiments of the present invention, the bottom plate 300 and the top plate 304 are conformally deposited using CVD to a thickness of about 0.5 to about 20 nm, although other thicknesses are within the contemplated scope of the invention. As depicted, the bottom plate 300 is conformally deposited in direct contact with the bottom plate contacts 102. As discussed previously herein, plate-to-contact resistance is minimized in the MIM capacitor 100 due in part to the use of metal lines to directly contact capacitor plates.

The capacitor dielectric layer 302 can be a dielectric material having a dielectric constant greater than 3.9. Non-limiting examples of suitable materials for the dielectric material include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum. The capacitor dielectric layer 302 can be formed by suitable deposition processes, for example, CVD, PECVD, ALD, evaporation, PVD, chemical solution deposition, or other like processes. The thickness of the layer can vary depending on the deposition process as well as the composition and number of high-k dielectric materials used. The capacitor dielectric layer 302 can have a thickness in a range from about 0.5 to about 20 nm.

Figure 4:
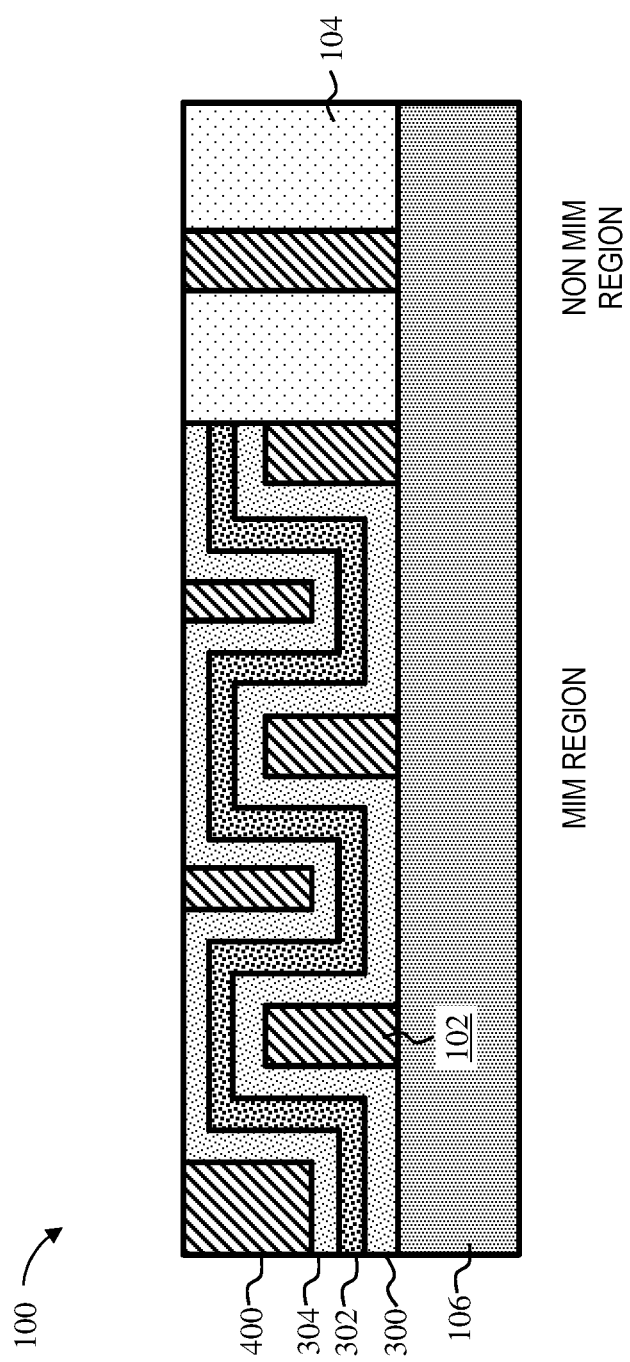
FIG. 4 depicts a cross-sectional view of the MIM capacitor of FIG. 3 after a fabrication operation according to embodiments of the invention.

FIG. 4 depicts a cross-sectional view of the MIM capacitor 100 after forming one or more top plate contacts 400 during an intermediate operation of a method of fabricating a semiconductor device according to one or more embodiments of the present invention. The top plate contacts 400 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition.

The top plate contacts 400 can be formed using known metallization techniques. In some embodiments of the present invention, the top plate contacts 400 are formed using a metal seed and plating process (e.g., deposit a Cu seed, and then plate Cu). In some embodiments of the invention, the top plate contacts 400 form overburdens above a surface of the top plate 304. In some embodiments of the invention, a CMP removes the overburden. In some embodiments of the present invention, the top plate 304 serves as a liner for planarization. In other words, the CMP can be selective to the top plate 304. As depicted, the top plate 304 is conformally deposited in direct contact with the top plate contacts 400. As discussed previously herein, plate-to-contact resistance is minimized in the MIM capacitor 100 due in part to the use of metal lines to directly contact capacitor plates.

Figure 5:
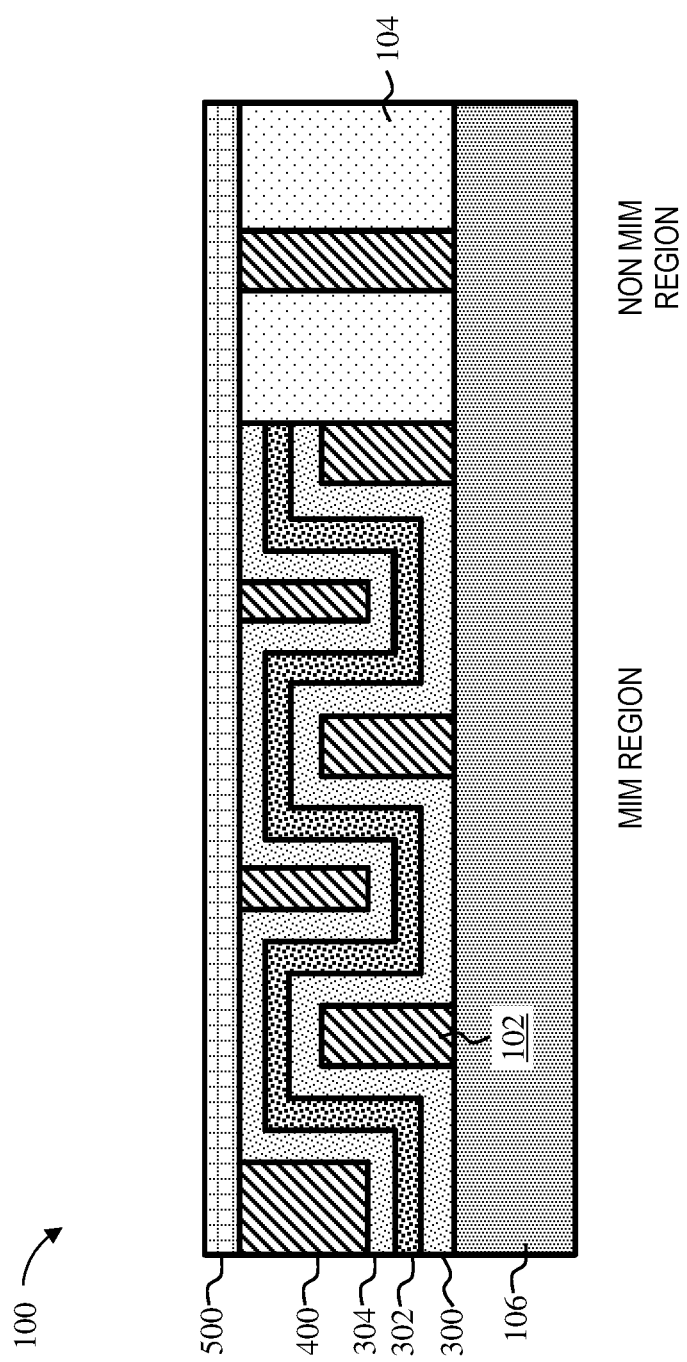
FIG. 5 depicts a cross-sectional view of the MIM capacitor of FIG. 4 after a fabrication operation according to embodiments of the invention.

FIG. 5 depicts a cross-sectional view of the MIM capacitor 100 after forming a capping layer 500 during an intermediate operation of a method of fabricating a semiconductor device according to one or more embodiments of the present invention. As depicted, the capping layer 500 is formed on a surface of the top plate 304. The capping layer 500 can be made of any suitable dielectric material, such as, for example, a silicon oxide, silicon nitride, silicon oxynitride, or a combination thereof. The capping layer 500 can be formed using any suitable deposition process. In some embodiments of the present invention, the capping layer 500 is formed using CVD, PECVD, ALD, evaporation, PVD, chemical solution deposition, spin on, or other like processes.

Figure 6:
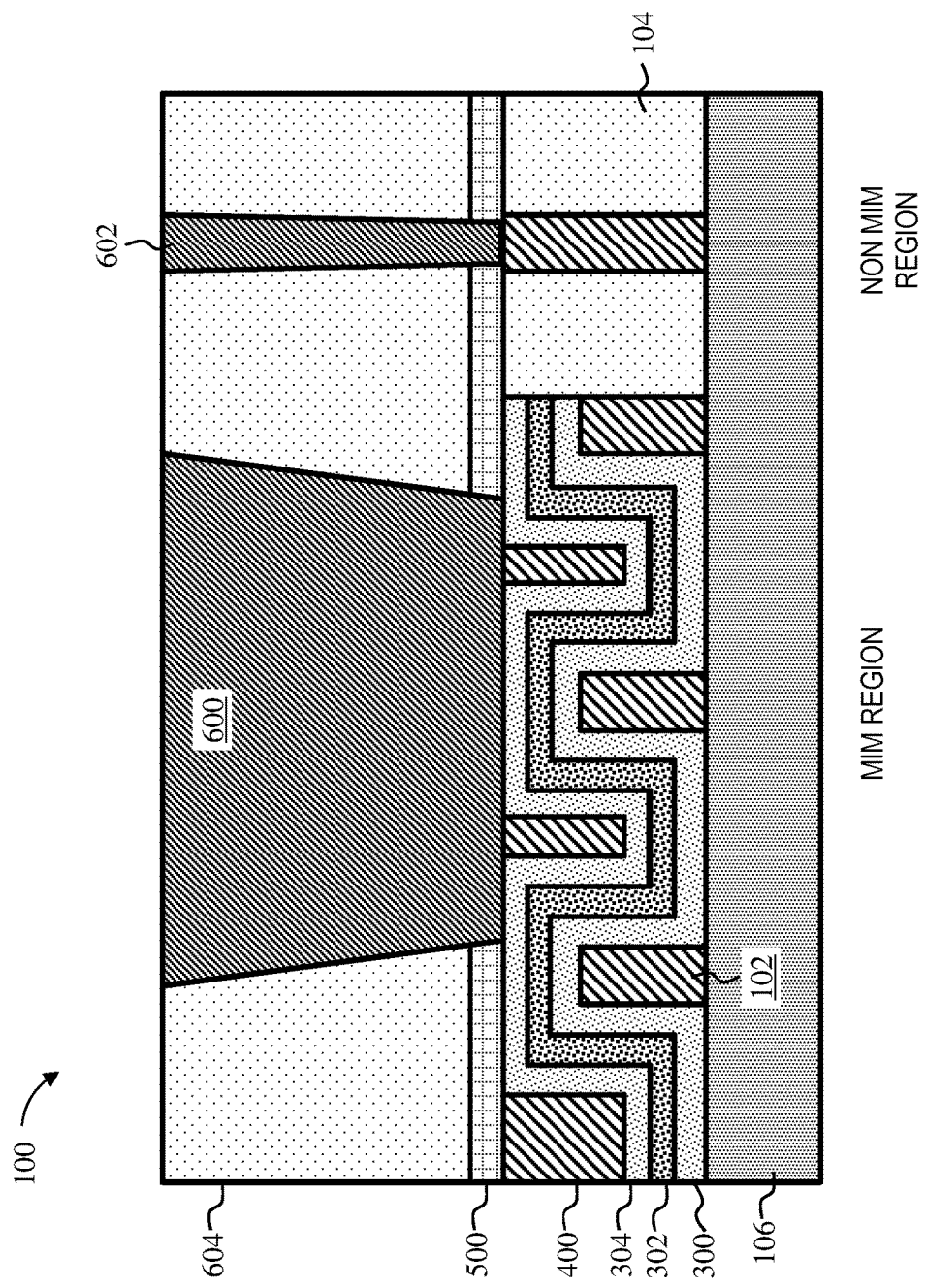
FIG. 6 depicts a cross-sectional view of the MIM capacitor of FIG. 5 after a fabrication operation according to embodiments of the invention.

FIG. 6 depicts a cross-sectional view of the MIM capacitor 100 after forming one or more MIM contacts 600 and one or more non-MIM contacts 602 during an intermediate operation of a method of fabricating a semiconductor device according to one or more embodiments of the present invention. The contacts 600 and 602 can be formed using known metallization techniques. In some embodiments of the invention, additional dielectric material is deposited over the capping layer 500 to form a dielectric layer 604. The dielectric layer 604 can then be patterned into open trenches (not depicted) using known processes, such as a wet or dry etch. In some embodiments of the invention, the contacts 600 and 602 are overfilled into the trenches, forming overburdens above a surface of the dielectric layer 604. In some embodiments of the invention, a CMP removes the overburden. In some embodiments of the present invention, the MIM contact 600 is formed in direct contact with the top plate 304 and the top plate contacts 400.

The contacts 600 and 602 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments of the invention, the contacts 600 and 602 can include a barrier metal liner (not depicted). For example, an ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

Figure 7:
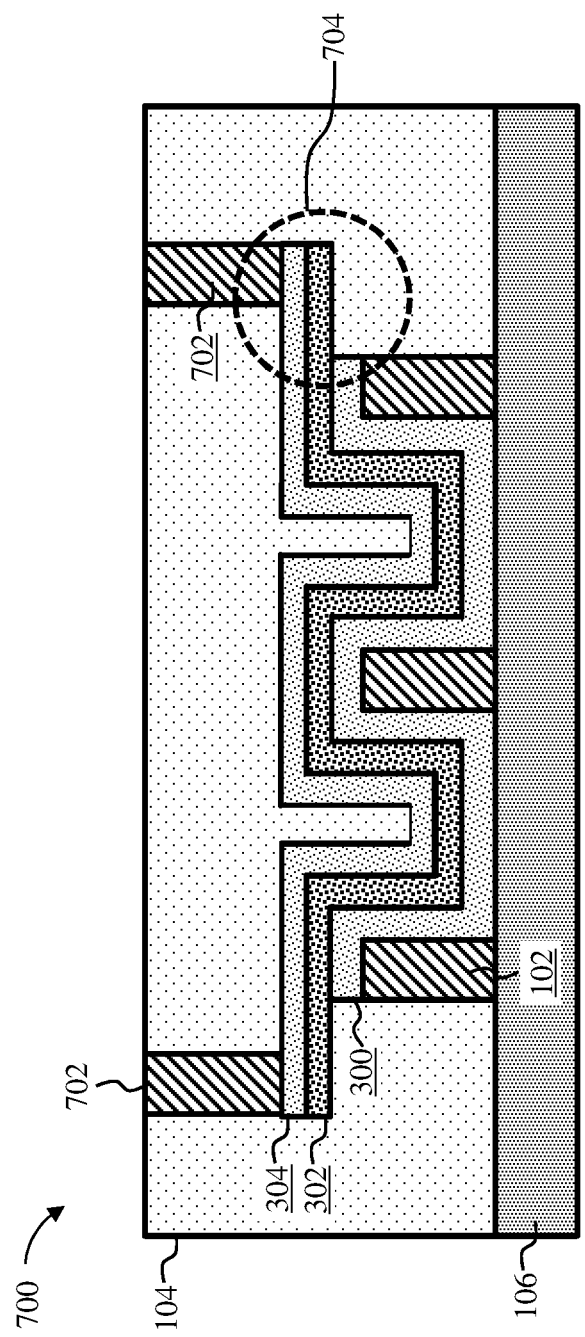
FIG. 7 depicts a cross-sectional view of a MIM capacitor during an intermediate operation of a method of fabricating a semiconductor device according to one or more embodiments of the present invention.

FIG. 7 depicts a cross-sectional view of a MIM capacitor 700 during an intermediate operation of a method of fabricating a semiconductor device according to one or more embodiments of the present invention. The MIM capacitor 700 is an alternative embodiment of the MIM capacitor 100. The MIM capacitor 700 is formed in a similar manner as the MIM capacitor 100 and includes one or more bottom plate contacts 102 and a MIM stack including a bottom plate 300, a capacitor dielectric layer 302, and a top plate 304. The MIM capacitor 700, however, includes one or more offset top plate contacts 702 formed in one or more offset regions 704. As depicted, the top plate 304 is formed directly on a surface of the capacitor dielectric layer 302 and includes a first portion that extends past a sidewall of the bottom plate 300 in a direction parallel to the substrate 106. The offset top plate contacts 702 are formed on a surface of the first portion of the top plate 304 in the offset regions 704. The offset top plate contacts 702 preferably are offset from the bottom plate contacts 102 by an edge-to-edge (sidewall-to-sidewall) distance of 1 to 200 nm, although other offset distances are within the contemplated scope of the invention. This offset distance advantageously serves to reduce parasitic capacitance in the MIM capacitor 700 and eliminates the major defect mechanism of a top plate contact shorting with the bottom plate. In some embodiments of the present invention, the bottom plate 300 is patterned such that a sidewall of the bottom plate 300 is coplanar with a sidewall of the bottom plate contacts 102. In some embodiments of the present invention, the bottom plate 300 sidewall extends 1 to 100 nm past a sidewall of the bottom plate contacts 102. In some embodiments of the present invention, the top plate 304 is patterned such that a sidewall of the top plate 304 is coplanar with a sidewall of the offset top plate contacts 702. In other words, the top plate 304 can extend past a sidewall of the bottom plate 300 to provide a ledge for the offset top plate contacts 702.

Figure 8:
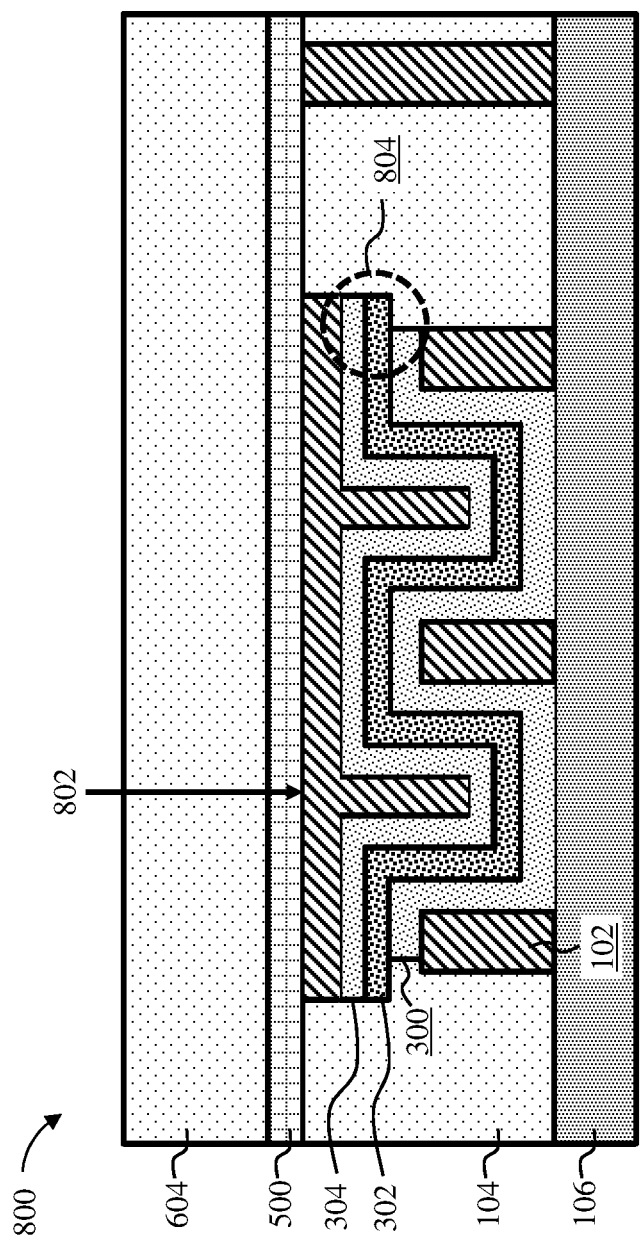
FIG. 8 depicts a cross-sectional view of a MIM capacitor during an intermediate operation of a method of fabricating a semiconductor device according to one or more embodiments of the present invention.

FIG. 8 depicts a cross-sectional view of a MIM capacitor 800 during an intermediate operation of a method of fabricating a semiconductor device according to one or more embodiments of the present invention. The MIM capacitor 800 is an alternative embodiment of the MIM capacitor 100. The MIM capacitor 800 is formed in a similar manner as the MIM capacitor 100 and includes one or more bottom plate contacts 102 and a MIM stack including a bottom plate 300, a capacitor dielectric layer 302, and a top plate 304. The MIM capacitor 800, however, includes a top plate contact 802 conformally formed over the entire top surface of the top plate 304 (also known as a crown-type top plate contact). In some embodiments of the present invention, the top plate contact 802 is formed to a thickness of 1 to 100 nm above the top surface of the top plate 304, although other thicknesses are within the contemplated scope of the invention. This configuration of the top plate contact 802 greatly increases the contact area between the top plate contact 802 and the top plate 304. In some embodiments of the present invention, the top plate 304 and capacitor dielectric layer 302 extend past a sidewall of the bottom plate contacts 102 in an offset region 804. In some embodiments of the present invention, the bottom plate 300 is coplanar to a sidewall of the bottom plate contacts 102.

Figure 9:
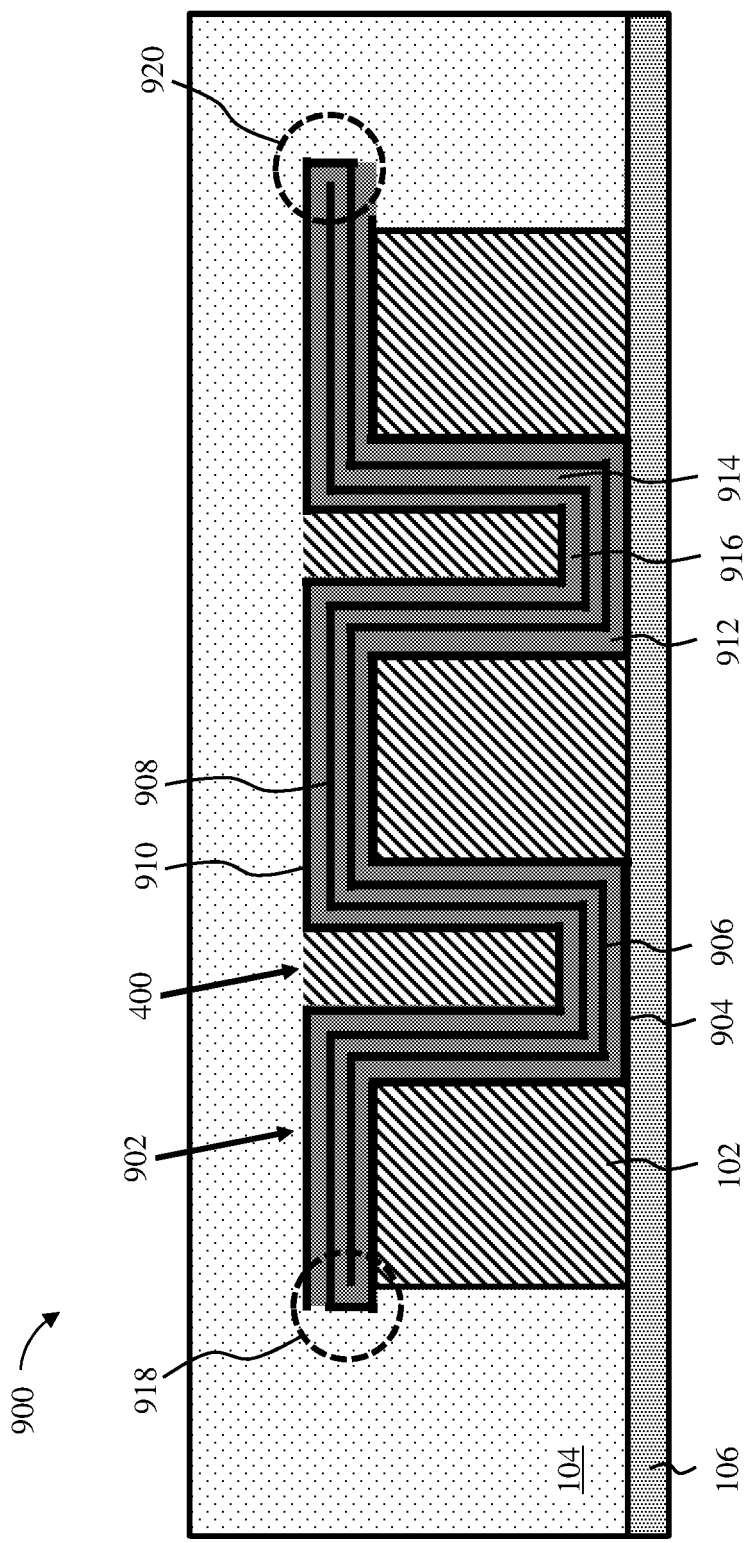
FIG. 9 depicts a cross-sectional view of a MIM capacitor during an intermediate operation of a method of fabricating a semiconductor device according to one or more embodiments of the present invention.

FIG. 9 depicts a cross-sectional view of a MIM capacitor 900 during an intermediate operation of a method of fabricating a semiconductor device according to one or more embodiments of the present invention. The MIM capacitor 900 is an alternative embodiment of the MIM capacitor 100. The MIM capacitor 900 is formed in a similar manner as the MIM capacitor 100 but includes a 3-high MIM capacitor stack 902. The 3-high MIM capacitor stack 902 further increases the capacitance density over that available using a single MIM capacitor stack (i.e., the single MIM stack defined by the bottom plate 300, capacitor dielectric layer 302, and top plate 304 as depicted in FIG. 3). As depicted, the 3-high MIM capacitor stack 902 includes four MIM capacitor plates 904, 906, 908, and 910. Each plate is separated by one of three capacitor dielectric layers 912, 914, and 916, in a similar manner as the MIM capacitor 100. As discussed previously herein, a single MIM capacitor stack includes a top and bottom plate separated by a capacitor dielectric layer. Accordingly, the 3-high MIM capacitor stack 902 includes a first MIM capacitor (defined by plates 904 and 906 and capacitor dielectric layer 912), a second MIM capacitor (defined by plates 906 and 908 and capacitor dielectric layer 914), and a third MIM capacitor (defined by plates 908 and 910 and capacitor dielectric layer 916). The 3-high MIM capacitor stack 902 is depicted as a 3-high stack for ease of illustration. It is understood, however, that the MIM capacitor 900 could be formed having any number of stacked MIM capacitors. For example, the MIM capacitor 900 can include a stack of 2, 3, 4, 5, 6, 7, 8, 9, 10 or more MIM capacitors.

In some embodiments of the present invention, the MIM capacitor 900 further includes one or both shorting joints 918 and 920 (edge connections). As depicted, the shorting joint 918 shorts the plate 904 to the plate 908 and the shorting joint 920 shorts the plate 906 to the plate 910. In some embodiments of the present invention, the shorting joints 918 and 920 are made of a same material as the MIM capacitor plates 904, 906, 908, and 910. The shorting joints 918 and 920 each electrically couple a pair of the MIM capacitor plates 904, 906, 908, and 910, and serve to reduce plate resistance in the MIM capacitor 900. In this manner, the 3-high MIM capacitor stack 902 can serve as a single, low resistance, high capacity MIM capacitor.

Figure 10:
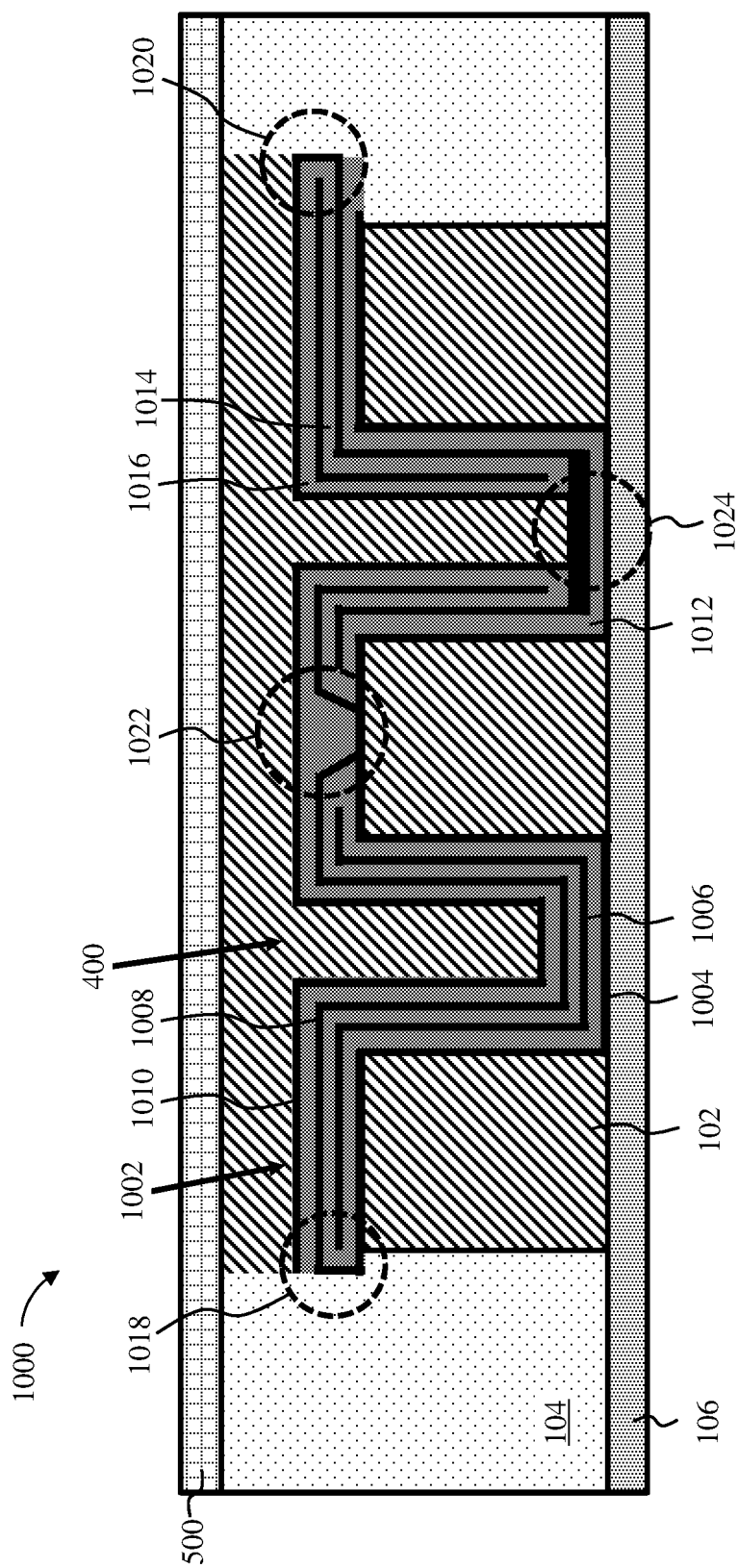
FIG. 10 depicts a cross-sectional view of a MIM capacitor during an intermediate operation of a method of fabricating a semiconductor device according to one or more embodiments of the present invention.

FIG. 10 depicts a cross-sectional view of a MIM capacitor 1000 during an intermediate operation of a method of fabricating a semiconductor device according to one or more embodiments of the present invention. The MIM capacitor 1000 is an alternative embodiment of the MIM capacitor 900. The MIM capacitor 1000 is formed in a similar manner as the MIM capacitor 900 and includes a 3-high MIM capacitor stack 1002. As discussed previously herein, the 3-high MIM capacitor stack 1002 further increases the capacitance density over that available using a single MIM capacitor stack. As depicted, the 3-high MIM capacitor stack 1002 includes four MIM capacitor plates 1004, 1006, 1008, and 1010. Each plate is separated by one of three capacitor dielectric layers 1012, 1014, and 1016, in a similar manner as the MIM capacitor 900. The MIM capacitor 1000 also includes shorting joints 1018 and 1020, for electrically coupling pairs of the MIM capacitor plates 1004, 1006, 1008, and 1010.

In addition to the shorting joints 1018 and 1020, the MIM capacitor 1000 includes internal shorting joints 1022 and

1024. As depicted, the internal shorting joint 1022 shorts the plate 1004 to the plate 1008 and the shorting joint 1024 shorts the plate 1006 to the plate 1010. The internal shorting joints 1022 and 1024 further reduce the plate resistance of the MIM capacitor 1000 beyond that which is possible using only the shorting joints 1018 and 1020 (as depicted in FIG. 9).

Figure 11:
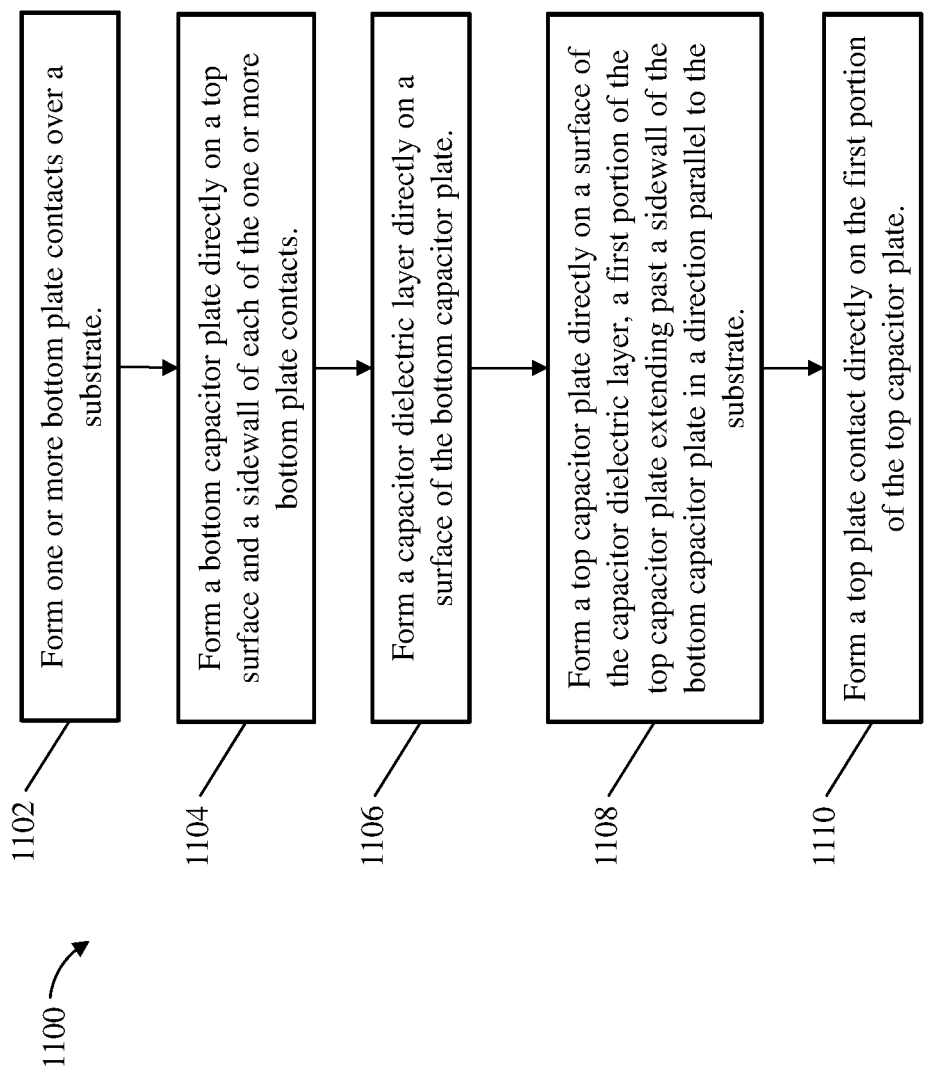
FIG. 11 depicts a flow diagram illustrating a method for forming a semiconductor device according to one or more embodiments of the invention.

FIG. 11 depicts a flow diagram 1100 illustrating a method for forming a MIM capacitor according to one or more embodiments of the invention. As shown at block 1102, one or more bottom plate contacts are formed over a substrate. The bottom plate contacts can be formed in a similar manner as the bottom plate contacts 102 (depicted in FIG. 1).

At block 1104, a bottom capacitor plate is formed directly on a top surface and a sidewall of each of the one or more bottom plate contacts. The bottom capacitor plate can be conformally formed over the bottom plate contacts as described previously herein.

At 1106, a capacitor dielectric layer is formed directly on a surface of the bottom capacitor plate. The capacitor dielectric layer can be formed in a similar manner as the capacitor dielectric layer 302 (depicted in FIG. 3).

During step 1108, a top capacitor plate is formed directly on a surface of the capacitor dielectric layer. In some embodiments of the present invention, a first portion of the top capacitor plate extends past a sidewall of the bottom capacitor plate in a direction parallel to the substrate (as depicted in FIG. 7).

At 1110, the method includes forming a top plate contact directly on the first portion of the top capacitor plate. The top plate contact can be formed in a similar manner as the top plate contacts 702 (as depicted in FIG. 7).

Figure 12:
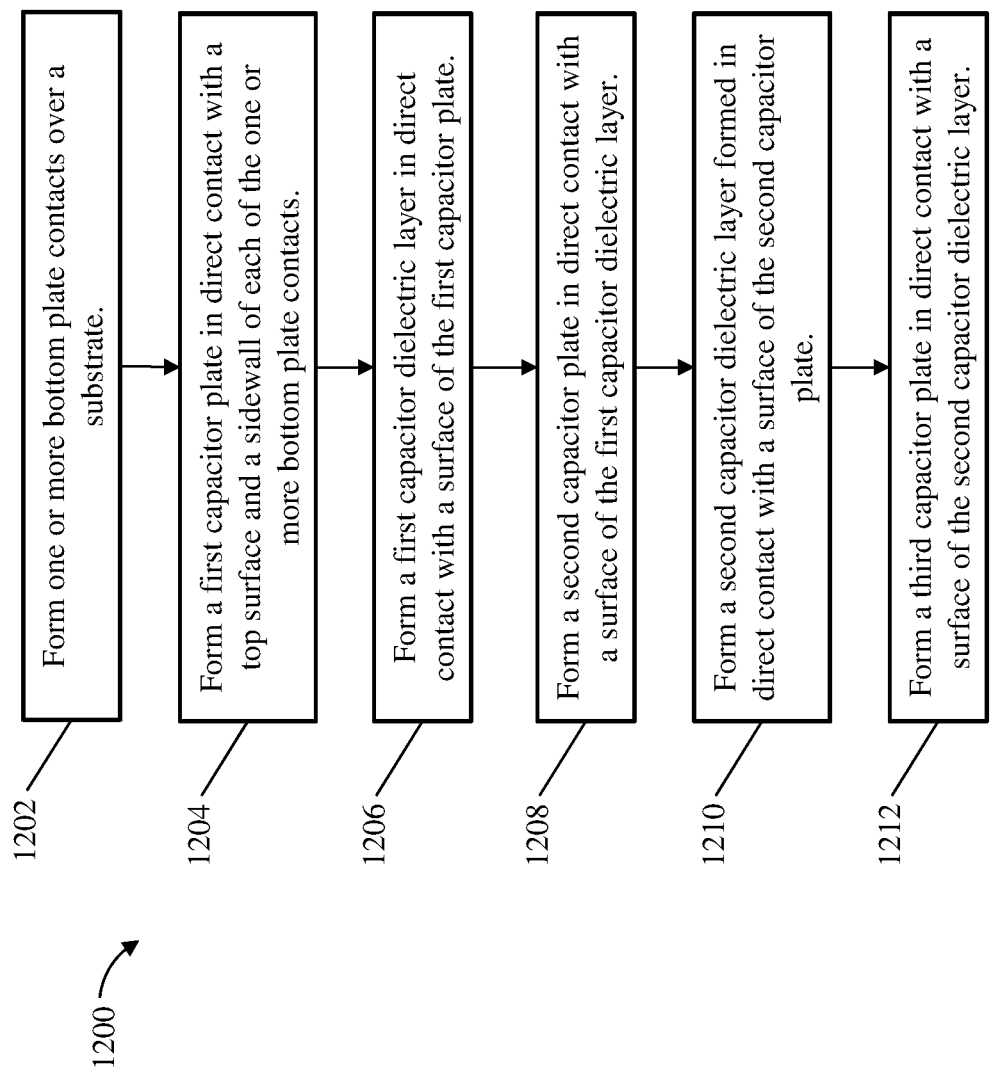
FIG. 12 depicts a flow diagram illustrating a method for forming a semiconductor device according to one or more embodiments of the invention.

FIG. 12 depicts a flow diagram 1200 illustrating a method for forming a MIM capacitor according to one or more embodiments of the invention. As shown at block 1202, one or more bottom plate contacts are formed over a substrate. The bottom plate contacts can be formed in a similar manner as the bottom plate contacts 102 (depicted in FIG. 9).

The method includes, at block 1204, forming a first capacitor plate in direct contact with a top surface and a sidewall of each of the one or more bottom plate contacts. A first capacitor dielectric layer is formed in direct contact with a surface of the first capacitor plate at step 1206. The first capacitor plate and first capacitor dielectric layer can be formed in a similar manner as the plate 904 and the capacitor dielectric layer 912 (as depicted in FIG. 9).

At block 1208, a second capacitor plate is formed in direct contact with a surface of the first capacitor dielectric layer. A second capacitor dielectric layer is formed in direct contact with a surface of the second capacitor plate at block 1210. The second capacitor plate and second capacitor dielectric layer can be formed in a similar manner as the plate 906 and the capacitor dielectric layer 914 (as depicted in FIG. 9).

At block 1212, a third capacitor plate is formed in direct contact with a surface of the second capacitor dielectric layer. The third capacitor plate can be formed in a similar manner as the plate 908 (as depicted in FIG. 9).

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on the semiconductor surface, and can not deposit material on exposed surfaces, such as silicon dioxide or silicon nitride surfaces.

As previously noted herein, for the sake of brevity, conventional techniques related to a semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilizes a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
   forming one or more bottom plate contacts including a barrier metal liner with a high electrical conductivity over a substrate;
   forming a bottom capacitor plate directly on a top surface and a sidewall of each of the one or more bottom plate contacts, wherein a sidewall of the bottom capacitor plate is in direct contact with an entirety of a sidewall of one bottom plate contact of the one or more bottom plate contacts;
   forming a capacitor dielectric layer directly on a surface of the bottom capacitor plate, a first portion of the capacitor dielectric layer extending in a direction parallel to the substrate and remaining above a highest portion of the one or more bottom plate contacts forming an offset region;
   forming a top capacitor plate directly on a surface of the capacitor dielectric layer, a first portion of the top capacitor plate extending above the offset region; and
   forming a top plate contact directly on the first portion of the top capacitor plate so as not to overlay a portion of the bottom capacitor plate in the offset region, wherein the one bottom plate contact of the one or more bottom plate contacts has a top surface in direct contract with the bottom capacitor plate and a bottom surface in direct contact with the substrate, the one bottom plate contact having an entirety of another sidewall in direct contact with dielectric material, the another sidewall and the sidewall of the one bottom plate contact being opposite one another.

2. The method of claim 1, wherein the one or more bottom plate contacts comprise a line width of greater than or equal to about 0.1 microns.

3. The method of claim 1, wherein the one or more bottom plate contacts comprise a material selected from the group consisting of tungsten, titanium, tantalum, ruthenium, zirconium, cobalt, copper, aluminum, lead, platinum, tin, silver, and gold.

4. The method of claim 1, wherein the capacitor dielectric layer comprises a high-k dielectric material comprising a dielectric constant greater than 7.0.

5. The method of claim 4, wherein the high-k dielectric material is selected from the group consisting of hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

6. The method of claim 1 further comprising, prior to forming the bottom capacitor plate, forming a hard mask over a first region of the substrate.

7. The method of claim 6 further comprising removing portions of an interlayer dielectric in a second region of the substrate that is not covered by the hard mask.

8. The method of claim 7 further comprising recessing a height of the one or more bottom plate contacts in the second region of the substrate.

9. A semiconductor device comprising:
   one or more bottom plate contacts including a barrier metal liner with a high electrical conductivity formed over a substrate;
   a bottom capacitor plate formed directly on a top surface and a sidewall of each of the one or more bottom plate contacts, wherein a sidewall of the bottom capacitor plate is in direct contact with an entirety of a sidewall of one bottom plate contact of the one or more bottom plate contacts;
   a capacitor dielectric layer formed directly on a surface of the bottom capacitor plate, a first portion of the capacitor dielectric layer extending in a direction parallel to the substrate and remaining above a highest portion of the one or more bottom plate contacts forming an offset region;
   a top capacitor plate formed directly on a surface of the capacitor dielectric layer, a first portion of the top capacitor plate extending above the offset region; and
   a top plate contact formed directly on the first portion of the top capacitor plate so as not to overlay a portion of the bottom capacitor plate in the offset region, wherein the one bottom plate contact of the one or more bottom plate contacts has a top surface in direct contract with the bottom capacitor plate and a bottom surface in direct contact with the substrate, the one bottom plate contact having an entirely of another sidewall in direct contact with dielectric material, the another sidewall and the sidewall of the one bottom plate contact being opposite one another.

10. The semiconductor device of claim 9, wherein the one or more bottom plate contacts comprise a line width of greater than or equal to about 0.1 microns.

11. The semiconductor device of claim 9, wherein the one or more bottom plate contacts comprise a material selected from the group consisting of tungsten, titanium, tantalum, ruthenium, zirconium, cobalt, copper, aluminum, lead, platinum, tin, silver, and gold.

12. The semiconductor device of claim 9, wherein the capacitor dielectric layer comprises a high-k dielectric material comprising a dielectric constant greater than 7.0.

13. The semiconductor device of claim 12, wherein the high-k dielectric material is selected from the group consisting of hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

14. The method of claim 1, wherein no portion of the bottom capacitor plate is immediately under the top plate contact in the offset region.

15. The method of claim 1, wherein the sidewall of the bottom capacitor plate is coplanar with the sidewall of the one or more bottom plate contacts; and
   wherein a sidewall of the top plate contact is coplanar with a sidewall of the top capacitor plate.

16. The method of claim 1, wherein a bottom surface of the bottom capacitor plate is directly on the substrate.

17. The method of claim 1, wherein the dielectric material extends from the one bottom plate contact to a side surface of the top plate contact.

* * * * *